United States Patent
Park

(10) Patent No.: US 7,858,432 B2
(45) Date of Patent: Dec. 28, 2010

(54) METHOD OF MANUFACTURING SOLAR CELLS WITH BURIED CONTACTS WITH A LASER

(75) Inventor: Sang-Wook Park, Suwon-si (KR)

(73) Assignee: Samsung SDI Co., Ltd., Gongse-dong, Giheung-gu, Yongin-si, Gyeonggi-do (KR)

(*) Notice: Subject to any disclaimer, the term of this patent is extended or adjusted under 35 U.S.C. 154(b) by 567 days.

(21) Appl. No.: 11/649,247

(22) Filed: Jan. 4, 2007

(65) Prior Publication Data

US 2007/0157965 A1   Jul. 12, 2007

(30) Foreign Application Priority Data

Jan. 6, 2006   (KR) .................. 10-2006-0001683

(51) Int. Cl.
*H01L 21/00* (2006.01)
*H01L 31/00* (2006.01)

(52) U.S. Cl. .................. 438/98; 136/252; 136/256
(58) Field of Classification Search ......... 136/243–265; 438/57–98

See application file for complete search history.

(56) References Cited

U.S. PATENT DOCUMENTS

| 4,892,592 | A  | * | 1/1990  | Dickson et al. ........... 136/244 |
| 5,468,652 | A  | * | 11/1995 | Gee ........................... 438/98 |
| 2004/0025932 | A1 | * | 2/2004 | Husher ..................... 136/256 |
| 2004/0058468 | A1 | * | 3/2004 | Takahashi et al. ........ 438/42 |

FOREIGN PATENT DOCUMENTS

| WO | WO 00/35024     | * | 11/1999 |
| WO | WO 01/82383 A1 | * | 4/2001  |

\* cited by examiner

*Primary Examiner*—Basia Ridley
*Assistant Examiner*—Christina Chern
(74) *Attorney, Agent, or Firm*—Robert E. Bushnell, Esq.

(57) ABSTRACT

A buried contact solar cell which is capable of operating with high efficiency is manufactured by a method which comprises the steps of forming a groove in a surface of a substrate, and forming an electrode by filling a conductive material in the groove using a laser. The step of forming the electrode may include positioning a conductive thin plate above the surface of the substrate, melting the conductive thin plate using a laser in a pattern corresponding to the groove, filling the conductive material in the groove, and removing the conductive thin plate.

6 Claims, 4 Drawing Sheets

METHOD OF MANUFACTURING SOLAR CELLS WITH BURIED CONTACTS WITH A LASER

CLAIM OF PRIORITY

This application makes reference to, incorporates the same herein, and claims all benefits accruing under 35 U.S.C.§119 from an application for SOLAR CELL AND METHOD OF MANUFACTURING THE SAME earlier filed in the Korean Intellectual Property Office on 6 Jan. 2006 and there duly assigned Ser. No. 10-2006-0001683.

BACKGROUND OF THE INVENTION

1. Field of the Invention

The present invention relates to a solar cell and a method of manufacturing the same, and more particularly, to a buried contact solar cell capable of accomplishing high efficiency and a method of manufacturing the same.

2. Description of the Related Art

A solar cell generates electric energy using solar energy. The solar cell is eco-friendly and has an infinite energy source and a long life span. The solar cell can be a silicon solar cell and a dye-sensitized solar cell.

The silicon solar cell includes a semiconductor substrate and an emitter layer that are of different conductive types so as to form a PN junction, a front electrode electrically connected to the emitter layer, and a rear electrode electrically connected to the semiconductor substrate.

The front electrode shields solar light. Accordingly, the amount of solar light which enters the solar cell is reduced by the front electrode. The loss of solar light is referred to as "shading loss." In order to reduce the shading loss, it is preferable that the line width of the front electrode be reduced.

In order to reduce the line width of the front electrode, a buried contact solar cell in which a groove having a size corresponding to the line width of the front electrode is formed in a semiconductor substrate, and in which the front electrode is formed in the groove, has been suggested. As a method of forming the front electrode in the groove, a non-electrolytic plating method, an electrolytic plating method, a screen printing method, or an evaporation method may be used.

In the non-electrolytic plating method and the electrolytic plating method, the solution is hard to be managed, the process time is long, and productivity is low. As the line width of the groove is reduced, an undesired hole remains in the electrode, and thus a high-density electrode is difficult to be formed. In the screen printing method, there is a limit to reduction of the line width of the front electrode formed in the groove. In the evaporation method, the process is complicated, an expensive apparatus and material are required, and productivity is low.

That is, a conventional method of forming a front electrode has poor productivity. Since the front electrode is difficult to be formed in the groove with high density, failure rate is high and resistance property is low. In addition, it is substantially impossible to form the front electrode in a groove having a small line width of, for example, 50 μm. Accordingly, there is a limit to reduction of the shading loss.

SUMMARY OF THE INVENTION

In order to solve the aforementioned problems, the present invention provides a solar cell which is capable of improving resistance property while reducing failure rate and shading loss by forming an electrode in a groove having a small line width with high density.

The present invention also provides a method of manufacturing a solar cell, which method is capable of improved productivity by forming en electrode in a groove having a small line width by means of a simple process.

According to an aspect of the present invention, a method of manufacturing a solar cell includes the steps of forming a groove in a surface of a substrate, and forming an electrode by filling a conductive material into the groove using a laser.

The step of forming the electrode may include the steps of positioning a thin conductive plate above the surface of the substrate, melting the thin conductive plate using the laser in a pattern corresponding to the groove, filling the conductive material into the groove, and removing the conductive thin plate.

The electrode may include at least one selected from the group consisting of copper, aluminum and silver.

The line width of the electrode may be in a range of 4 μm to 50 μm.

The groove may be formed using one of the laser and a scriber.

According to another aspect of the present invention, a method of manufacturing a solar cell includes the steps of providing a semiconductor substrate, forming an emitter layer on a first surface of the semiconductor substrate, forming a groove in the first surface of the semiconductor substrate, and forming a first electrode electrically connected to the emitter layer by filling a conductive material into the groove using a laser.

The step of forming the first electrode may include the steps of positioning a conductive thin plate above the emitter layer, melting the conductive thin plate using the laser in a pattern corresponding to the groove, filling the conductive material into the groove, and removing the conductive thin plate.

The electrode may include at least one selected from the group consisting of copper, aluminum and silver.

The line width of the electrode may be in a range of 4 μm to 50 μm.

The groove may be formed using one of the laser and a scriber.

The method may further include the step of forming a high-concentration emitter portion in a periphery of the groove before forming the first electrode.

The method may further include the step of forming a second electrode, which is electrically connected to the semiconductor substrate, on a second surface of the semiconductor substrate.

According to another aspect of the present invention, a solar cell comprises: a semiconductor substrate; an emitter layer formed on a surface of the semiconductor substrate; a first electrode electrically connected to the emitter layer; and a second electrode electrically connected to the semiconductor substrate; wherein a first groove is formed in the semiconductor substrate and the first electrode is concavely formed in the first groove.

The line width of the first electrode may be in a range of 4 μm to 50 μm.

A second groove may be formed in the semiconductor substrate, and the second electrode may be concavely formed in the second groove.

The line width of the second electrode may be in a range of 4 μm to 50 μm.

At least one of the first electrode and the second electrode may include at least one selected from the group consisting of copper, aluminum and silver.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, a solar cell and a method of manufacturing the same according to an embodiment of the present invention will be described in detail with reference to the attached drawings such that the present invention can be easily put into practice by those skilled in the art.

FIGS. 1A thru 1J are cross-sectional views showing a method of manufacturing a solar cell according to an embodiment of the present invention.

Figure 1A:
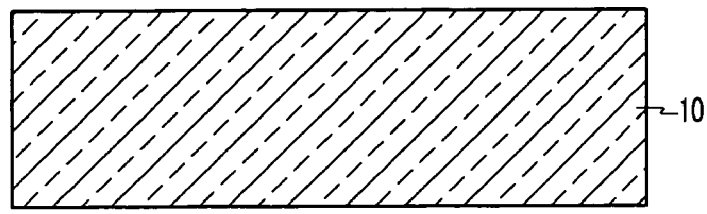
FIGS. 1A thru 1J are cross-sectional views showing a method of manufacturing a solar cell according to an embodiment of the present invention.

First, as shown in FIG. 1A, a p-type semiconductor substrate 10 formed of silicon is prepared. However, the present invention is not limited thereto. That is, an n-type semiconductor substrate or a semiconductor substrate formed of various semiconductor materials except silicon may be used.

In order to improve the property of the solar cell, a preprocessing step may be performed. The preprocessing step is performed by etching the semiconductor substrate 10 using an alkali aqueous solution or a mixed acid solution, and removing impurities using a cleaning solution. A damaged portion of the semiconductor substrate 10 is removed by the etching, and fine irregularities are formed in the surface of the semiconductor substrate 10. Accordingly, it is possible to reduce the loss of solar light.

Figure 1B:
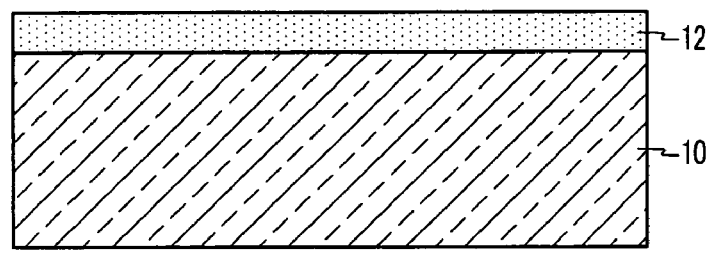

Subsequently, as shown in FIG. 1B, a dopant is doped into a front surface of the semiconductor substrate 10 to form an n-type emitter layer 12. In the present embodiment, for example, phosphorus is used in forming the n-type emitter layer 12. However, various materials other than phosphorus may be used. The conductive type of the emitter layer 12 must be opposite to that of the semiconductor substrate 10. Accordingly, when an n-type semiconductor substrate is used, a p-type emitter layer is formed.

The doping method may be any one of various methods, such as a high-temperature diffusion method, a spray method, a screen printing method, and an ion shower method. After doping, phosphorous silicate glass (PSG), which is formed unnecessarily, is removed using a hydrofluoric acid aqueous solution.

Figure 1C:
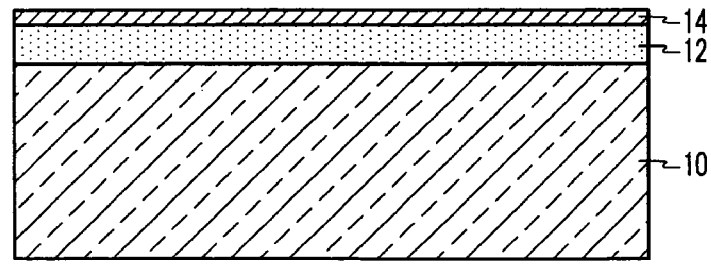

Subsequently, as shown in FIG. 1C, an insulating layer 14 is formed on the emitter layer 12. The insulating layer 14 may be a silicon nitride layer, a silicon oxide layer or a titanium oxide layer. The insulating layer 14 may be formed by any one of various methods, such as a plasma chemical vapor deposition method, an electron beam deposition method, a screen printing method, and a spray method.

The insulating layer 14 suppresses the incident solar light from being reflected from the surface of the substrate, and prevents electrons from being lost at the surface of the substrate. That is, the electrons may be lost at the surface of the substrate by dangling bond. Accordingly, it is possible to prevent the loss of the electrons due to the dangling bond by forming the insulating layer 14.

Figure 1D:
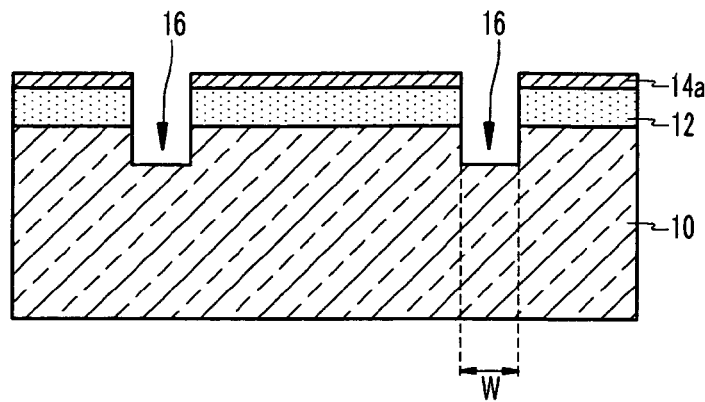

Next, as shown in FIG. 1D, a groove 16 is formed in the front surface of the semiconductor substrate 10 using a laser or a scriber. The groove 16 is a space in which a first electrode (reference numeral 22 of FIG. 1H) will be formed in a subsequent step. Accordingly, the line width W and the depth of the groove 16 are directly associated with the line width T (FIG. 1I) and the depth of the first electrode 22 (FIG. 1H), respectively. Moreover, the groove 16 must be formed in consideration of the line width and the depth of the first electrode. In view of the shading loss due to the first electrode 22, it is preferable that the line width of the groove 16 be small. Accordingly, in the present embodiment, the groove 16 has a line width of 4 μm to 50 μm. However, the present invention is not limited thereto, and the groove may have a different line width.

A damaged portion may be removed using the laser after the groove 16 is formed.

Figure 1E:
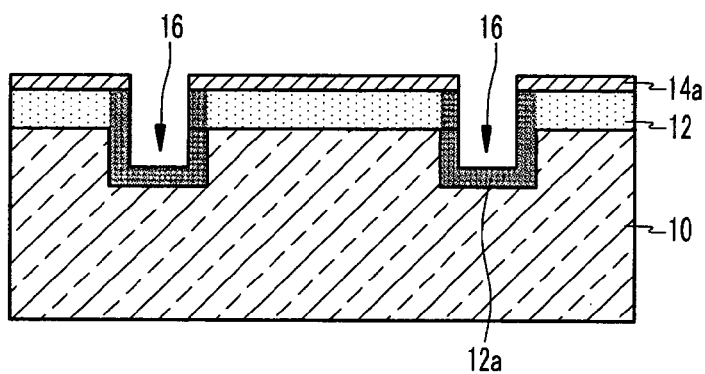

Subsequently, as shown in FIG. 1E, a dopant is doped into the peripheral portion of the groove 16 to form a high-concentration emitter portion 12a. The high-concentration emitter portion 12a reduces contact resistance with the first electrode 22. The method of doping the dopant may be any one of various methods, such as a high-temperature diffusion method, a spray method, a screen printing method, and an ion shower method.

Figure 1F:
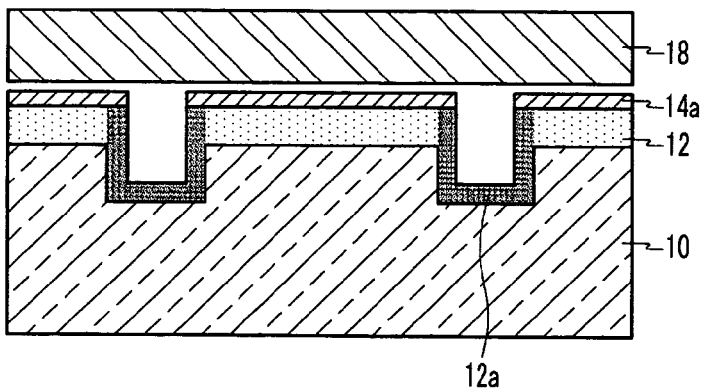
Figure 1G:
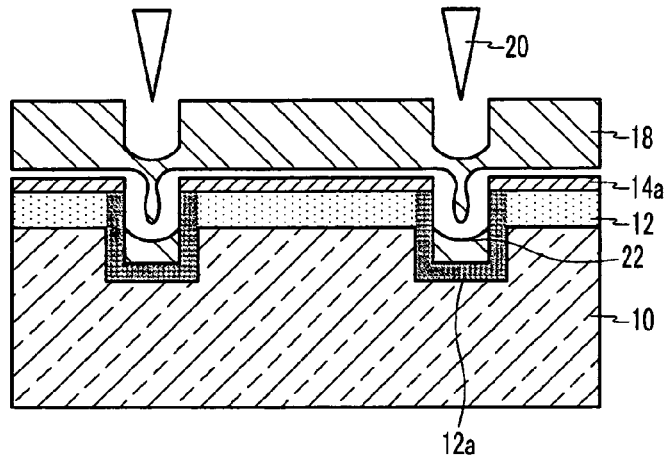
Figure 1H:
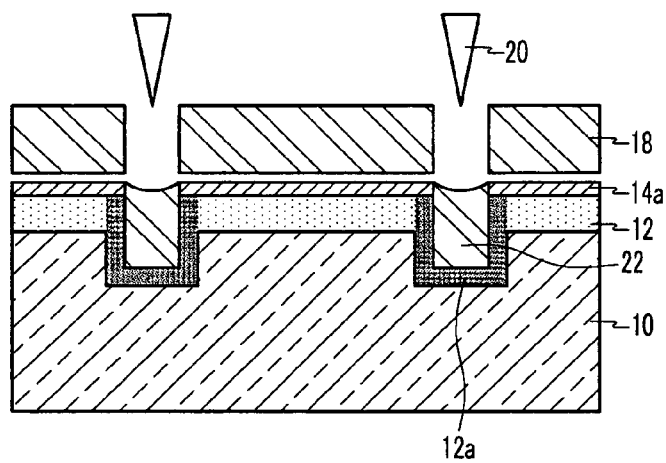

Next, the first electrode 22 is formed in the groove 16 by the steps shown in FIGS. 1F to 1H. These steps will now be described in detail.

First, as shown in FIG. 1F, a thin conductive plate 18 is positioned above the front surface of the semiconductor substrate 10, that is, the emitter layer 12.

Next, as shown in FIGS. 1G and 1H, the thin conductive plate 18 is made molten using a laser 20 in a pattern corresponding to the groove 16, and the molten conductive material is filled into the groove 16, thereby forming the first electrode 22. In the present embodiment, since the groove 16 has a line width W of 4 μm to 50 μm, the line width T (FIG. 1I) of the first electrode 22 is 4 μm to 50 μm.

At this point, the first electrode 22 may be formed by moving one laser 20 in a pattern corresponding to the groove 16.

Here, the first electrode 22 may be formed of copper, aluminum and silver.

Figure 1I:
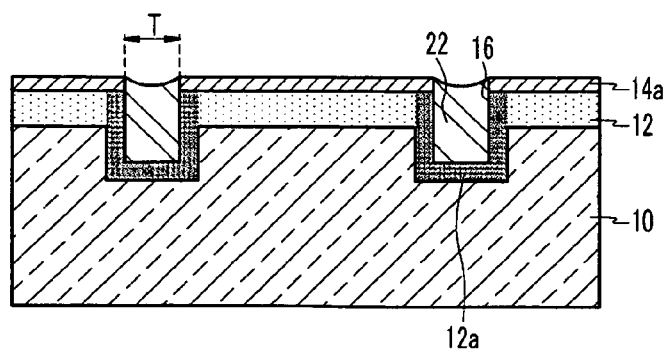

Next, as shown in FIG. 1I, the conductive thin plate 18 is removed.

In the present embodiment, since the first electrode 22 is formed using a laser, it is possible to form the first electrode 22 in the groove 16 having a smaller line width than that of the prior art. That is, it is possible to efficiently reduce the line width T of the first electrode 22. Accordingly, it is possible to minimize shading loss due to the first electrode 22. Since the conductive material is filled in the groove 15 in a molten state, it is possible to form the first electrode 22 with high density and to improve resistance property. It is also possible to form the first electrode 22 by means of a simple process using only the laser (reference numeral 20 of FIG. 1G) and the conductive thin plate (reference numeral 18 of FIG. 1G), and to improve productivity.

Figure 1J:
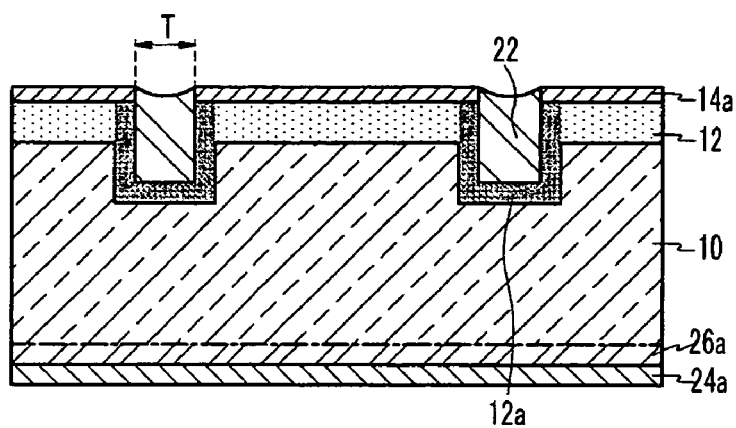

Subsequently, as shown in FIG. 1J, an aluminum paste is screen-printed on a rear surface of the semiconductor substrate 10 and is heated to form a second electrode 24a electrically connected to the semiconductor substrate 10. However, the present invention is not limited thereto. The second electrode 24a may be formed of various materials and such a modification is within the scope of the present invention.

At this point, aluminum is diffused into the rear surface of the semiconductor substrate 10 to a predetermined thickness by a heating treatment to form a p+-type rear field layer 26a. Since the rear field layer 26a generates an electric field, photoexcited electrons are prevented from moving to the rear surface of the semiconductor substrate 10.

Although the second electrode 24a is formed after the first electrode 22 is formed in the above-described embodiment, the present invention is not limited thereto. The second electrode 24a may be formed before the first electrode 22 is formed, and such a modification is within the scope of the present invention.

In the solar cell manufactured by the above-described manufacturing method, the first electrode 22 is concavely formed only in the groove 16. This is because the first electrode 22 is formed by filling the molten conductive material into the groove 16 using a laser. This structure is different from that of the prior art in which the first electrode is convexly formed in the edge of the groove. That is, in the prior art, since the first electrode is formed by an electrolytic plating method or a non-electrolytic plating method, the conductive material remains in the periphery of the edge of the groove, and a portion of the first electrode is located outside the groove. In contrast, in the present invention, since the first electrode 22 is formed only in the groove 16 except for an undesired portion, it is possible to form the first electrode 22 with high precision.

When light enters the solar cell manufactured by the above-described manufacturing method, hole-electron pairs generated by photoelectric effect are separated, electrons are concentrated to the n-type emitter layer 12 and holes are concentrated to the p-type semiconductor substrate 10, thereby generating a potential difference. Due to this potential difference, current flows in the first electrode 22, the second electrode 24a and an external circuit (not shown), and thus the solar cell operates.

As described above, the conductive type of the semiconductor substrate 10 and the conductive type of the emitter layer 12 and the high-concentration emitter portion 12a may vary, and such a modification is within the scope of the present invention.

Figure 2:
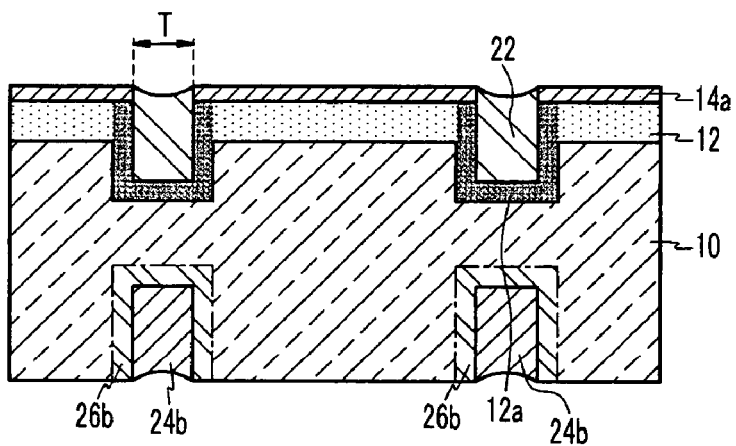
FIG. 2 is cross-sectional view showing a solar cell according to another embodiment of the present invention.

FIG. 2 is cross-sectional view showing a solar cell according to another embodiment of the present invention.

Although only the first electrode 22, which is electrically connected to the emitter layer 12, is formed in the groove 16 in a buried contact type arrangement in the above-described embodiment, the present invention is not limited thereto. As shown in FIG. 2, a second groove may be formed in the semiconductor substrate, and a second electrode 24b may be formed in the second groove. Such modification is within the scope of the present invention. In FIG. 2, reference numeral 26b denotes a rear field layer.

Although exemplary embodiments and modified examples of the present invention have been described, the present invention is not limited to the disclosed embodiments and examples, but it may be modified in various ways without departing from the scope of the present invention as defined by the appended claims, the detailed description, and the accompanying drawings. Therefore, it is natural that such modifications fall within the scope of the present invention.

According to the method of manufacturing a solar cell of the present invention, it is possible to manufacture a solar cell by means of a simple process using only a laser and a conductive thin plate, and to improve productivity.

Since a conductive material molten by the laser is filled into a groove to form the first electrode, the first electrode can be formed with higher density, and its resistance property can be improved while reducing failure rate.

Since the first electrode can be formed in a groove having a very small line width due to the property of the laser, it is possible to reduce the line width of the first electrode.

Since the solar cell manufactured by the method of the present invention includes a first electrode having a small line width, shading loss can be minimized, and thus efficiency can be improved.

What is claimed is:

1. A method of manufacturing a solar cell, comprising the steps of:
   providing a semiconductor substrate;
   forming an emitter layer on a surface of the semiconductor substrate;
   forming a groove in the surface of the semiconductor substrate; and
   forming a first electrode electrically connected to the emitter layer by filling a conductive material into the groove using a laser;
   wherein the step of forming the first electrode comprises the steps of positioning a conductive thin plate above the emitter layer, melting the conductive thin plate using the laser in a pattern corresponding to the groove, filling the conductive material into the groove, and removing the conductive thin plate from an entirety of the surface of the substrate.

2. The method of claim 1, wherein the electrode includes at least one selected from the group consisting of copper, aluminum and silver.

3. The method of claim 1, wherein a line width of the electrode is in a range of 4 μm to 50 μm.

4. The method of claim 1, wherein the groove is formed using one of the laser and a scriber.

5. The method of claim 1, further comprising the step of forming a high-concentration emitter portion in a periphery of the groove before forming the first electrode.

6. The method of claim 1, further comprising the step of forming a second electrode, which is electrically connected to the semiconductor substrate, on a second surface of the semiconductor substrate.

* * * * *